United States Patent [19]

Isozaki et al.

[11] Patent Number: 5,229,953

[45] Date of Patent: Jul. 20, 1993

[54] METHOD OF AND APPARATUS FOR ASSIGNING LOGIC GATES TO A PLURALITY OF HARDWARE COMPONENTS

[75] Inventors: Yuko Isozaki, Hachioji; Minoru Yamada, Hanno, both of Japan

[73] Assignee: Hitachi, Ltd., Tokyo, Japan

[21] Appl. No.: 596,509

[22] Filed: Oct. 12, 1990

[30] Foreign Application Priority Data

Oct. 13, 1989 [JP] Japan .................................. 1-264917

[51] Int. Cl.⁵ .............................................. G06F 15/60
[52] U.S. Cl. ..................................... 364/490; 364/489; 364/488
[58] Field of Search ................ 364/488, 489, 490, 491

[56] References Cited

U.S. PATENT DOCUMENTS

| | | | |
|---|---|---|---|
| T940,008 | 11/1975 | Oden et al. | 364/490 |
| T943,001 | 2/1976 | Mennone | 364/490 |
| T944,001 | 3/1976 | Hanan et al. | 364/490 |
| 4,636,966 | 1/1987 | Yamada et al. | 364/491 |
| 4,815,003 | 3/1989 | Putatunda et al. | 364/491 |
| 4,908,772 | 3/1990 | Chi | 364/491 |

OTHER PUBLICATIONS

"Partitioning and Placement Technique for CMOS Gate Arrays" by Odawara et al., IEEE Trans. on Computer-Aided Design, CAD-6, No. 3, May 1987, pp. 355-363.

"An Efficient Heuristic Procedure for Partitioning Graphs" by Kernighan et al., Bell System Tech. Journal, Feb. 1970, pp. 291-307.

"A Linear-Time Heuristic for Improving Network Partitions" by Fiduccia et al., IEEE 19th Design Automation Conf., 1982, pp. 175-179.

"Chortle: A Technology Mapping Program for Lookup Table-Based Field Programmable Gate Arrays" by Francis et al., 27th ACM/IEEE Design Automation Conf., 1990, pp. 613-619.

*Primary Examiner*—Vincent N. Trans
*Attorney, Agent, or Firm*—Antonelli, Terry, Stout & Kraus

[57] ABSTRACT

The logic gates are usually logically arranged in a first hierarchical structure in terms of a cluster of logical functions certain logic function elements are selected as to-be-processed function elements on the basis of the number of hardware components and a maximum allowable number of gates each hardware component can accommodate. Selected to-be-processed function elements in the first hierarchical structure are classified into at least two element groups based on connection strengths among the to-be-processed function elements and a maximum allowable number of pins and gates each hardware component can carry and accommodate, respectively. Using the classification result, the selected to-be-processed function elements in the first hierarchical structure are rearranged into a second hierarchical structure in terms of a cluster of logical functions in which all of the to-be-processed function elements are partitioned into the plurality of group elements so that each of the group elements corresponds to those of the logic function elements which are physically assignable to a different one of the hardware components.

7 Claims, 9 Drawing Sheets

FIG. 4A
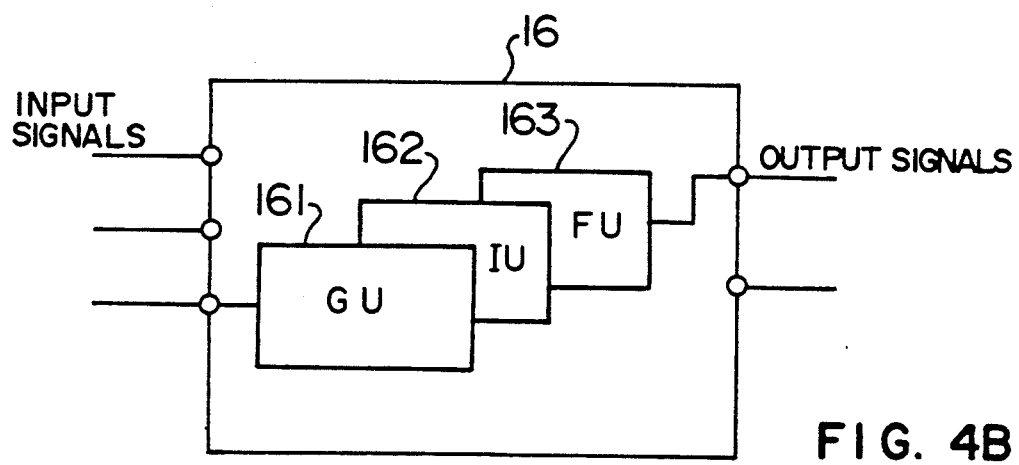
FIG. 4B
FIG. 4C
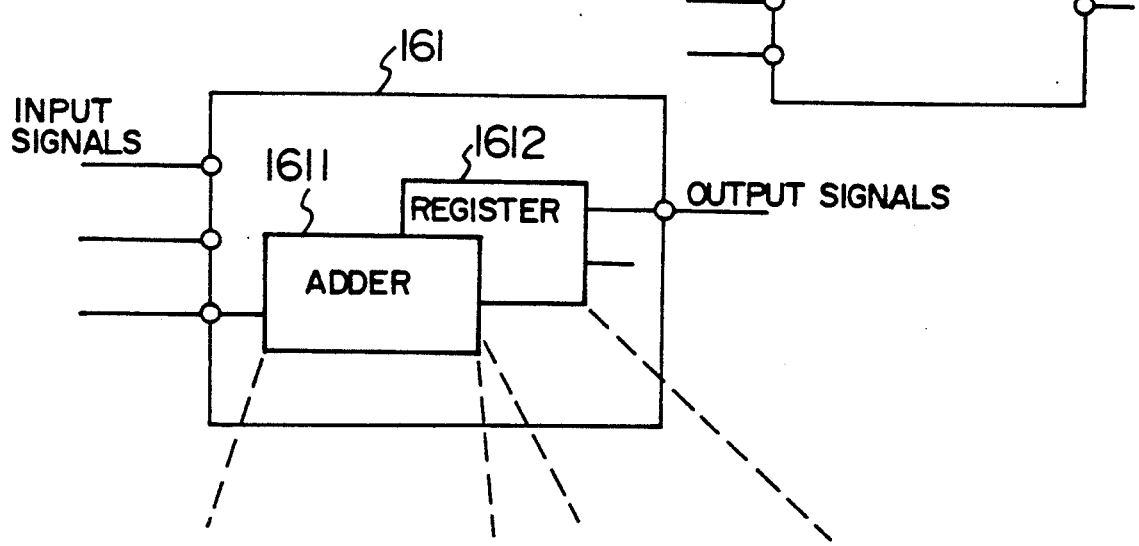

METHOD OF AND APPARATUS FOR ASSIGNING LOGIC GATES TO A PLURALITY OF HARDWARE COMPONENTS

BACKGROUND OF THE INVENTION

The present invention relates to a logic gate partitioning system for the logic design of a high-speed logic operation apparatus, and more particularly to an automatic logic gate partitioning system suitable for a hierarchically described logic structure.

Partitioning of logic gates is the process of assigning a multiplicity of logic gates to be connected for execution of a desired logic operation to hardware components such as, for example, boards, modules or LSI chips while satisfying restrictive conditions such as the maximum allowable number of logic gates which a hardware component can accommodate and the maximum allowable number of pins which the hardware component can carry. Heretofore, various methods of automatically performing the partitioning of logic gates by using a computer have been proposed.

General methods of automatically assigning logic gates pay attention to connection information between logic gates in partitioning the logic gates. One known method is a logic gate assigning method in which some cores are first produced and logic gates are incorporated into the cores in a descending order of the number of signal connection lines up to an allowable number of logic gates the hardware component can accommodate (e.g., see I. Nishioka et. al.: An approach to Gate Assignment and Module Placement for Printed Wiring Boards, IEEE Trans. Comput., Vol. C-29, No. 8, pp. 681-688 (1980)). A mapping method is also known in which logic gates are partitioned into some functional groups on the basis of connection information to assign the logic gates to a mounting unit for each functional group (e.g., see R. L. Russo: A Heuristic Procedure for the Partitioning and Mapping of Computer, Vol. C-20, No. 12, pp. 1455-1462 (1971)). Further, a method in which hierarchical logic information is utilized when a circuit is partitioned functionally (e.g., see T. S. Payne et. al.: Automated Partitioning of Hierarchical Specified Digital Systems. Proc. 19th Design Automation Conf., pp. 182-192 (1982)) has been published. However, all of those methods perform the partitioning of logic gates by treating all of the logic gates.

When the logic design of a high-speed logic operation apparatus such as a large computer including a multiplicity of logic gates is made, data corresponding to one million logic gates will have to be handled. A conventional automatic logic gate partitioning method which directly handles or treats logic gates needs examination of connection relations among one million logic gates, with a result that the logic gate partitioning procedure in the logic design of the computer is time-consuming and is not practical.

SUMMARY OF THE INVENTION

It is an object of the present invention to provide a method of and an apparatus for assigning a multiplicity of logic gates constituting a high-speed logic operation apparatus to hardware components, which is useful for reduction of the required design time of the high-speed logic operation apparatus such as a large computer.

According to one aspect of the present invention, logic function elements to be subjected to a partitioning process are selected from a multiplicity of logic function elements arranged in a first hierarchical structure in terms of a cluster of logic functions, and the to-be-processed elements in the first hierarchical structure are classified into two or more element groups on the basis of strengths of connection among the to-be-processed elements so that the to-be-processed elements are rearranged in a second hierarchical structure in accordance with the classified result. Each of the element groups in the second hierarchical structure represents one or more logic gates to be assigned to one hardware component.

According to another aspect of the present invention, an apparatus is provided for assigning a plurality of logic gates to a plurality of hardware components, the logic gates being logically arranged in a first hierarchical structure in terms of a cluster of logical functions to constitute a high speed logic operation apparatus in which logic function elements at one level accommodate at least one logic function element at a next lower level and each of the logic gates is included in one of the logic function elements, the apparatus comprising:

a first memory for storing therein initial data with respect to hierarchical descriptions of logic operation of and hardware specification of the high speed logic operation apparatus, the data on the hardware specification including data with respect to a number of the plurality of hardware components, a maximum number of gates each of the hardware components can accommodate, strengths of connection among the logic function elements, and a maximum number of pins each of the hardware components can carry;

an input section for receiving the initial data from the first memory and buffering them;

means coupled to the input section for selecting a number of logic function elements as to-be-processed function elements among the logic function elements in the first hierarchical structure on the basis of the number of hardware components and the maximum number of gates each of·the hardware components can accommodate;

means coupled to the input means for classifying the to-be-processed logic function elements in the first hierarchical structure into at least two element groups on the basis of strengths of connection among the to-be-processed logic function elements, the maximum number of pins each of the hardware components can carry and the maximum number of gates each of the hardware components can accommodate;

means coupled to the classifying means for rearranging the to-be-processed logic function elements in the first hierarchical structure into a second hierarchical structure in terms of a cluster of logic functions in which all of the to-be-processed logic function elements are partitioned into the plurality of element groups so that each of the element groups corresponds to a plurality of logic function elements which are physically assignable to a different one of the hardware components;

an output section for receiving from the rearranging means data with respect to the second hierarchical structure and buffering them; and a second memory for storing therein the data with respect to the second hierarchical structure.

In the automatic logic partitioning operation in which a multiplicity of logic gates to be connected for execution of a desired logic operation are assigned to a plurality of hardware components having a predetermined maximum number of gates it can accommodate and having a predetermined maximum number of input/output pins it can carry, partitioning of logic gates is performed, without resorting to connection information among all of the logic gates. Instead the partitioning is performed by the use of a hierarchical description in terms of a cluster of logic functions. This reduces the number of the to-be-processed logic function elements and shortens the required processing time for assigning the logic gates to the hardware components eventually.

BRIEF DESCRIPTION OF THE DRAWINGS

FIGS. 4A, B and C are hierarchical illustrations of logic function elements at different levels, and each element including at least one of a multiplicity of logic gates constituting a computer.

DESCRIPTION OF THE PREFERRED EMBODIMENTS

Figure 1:
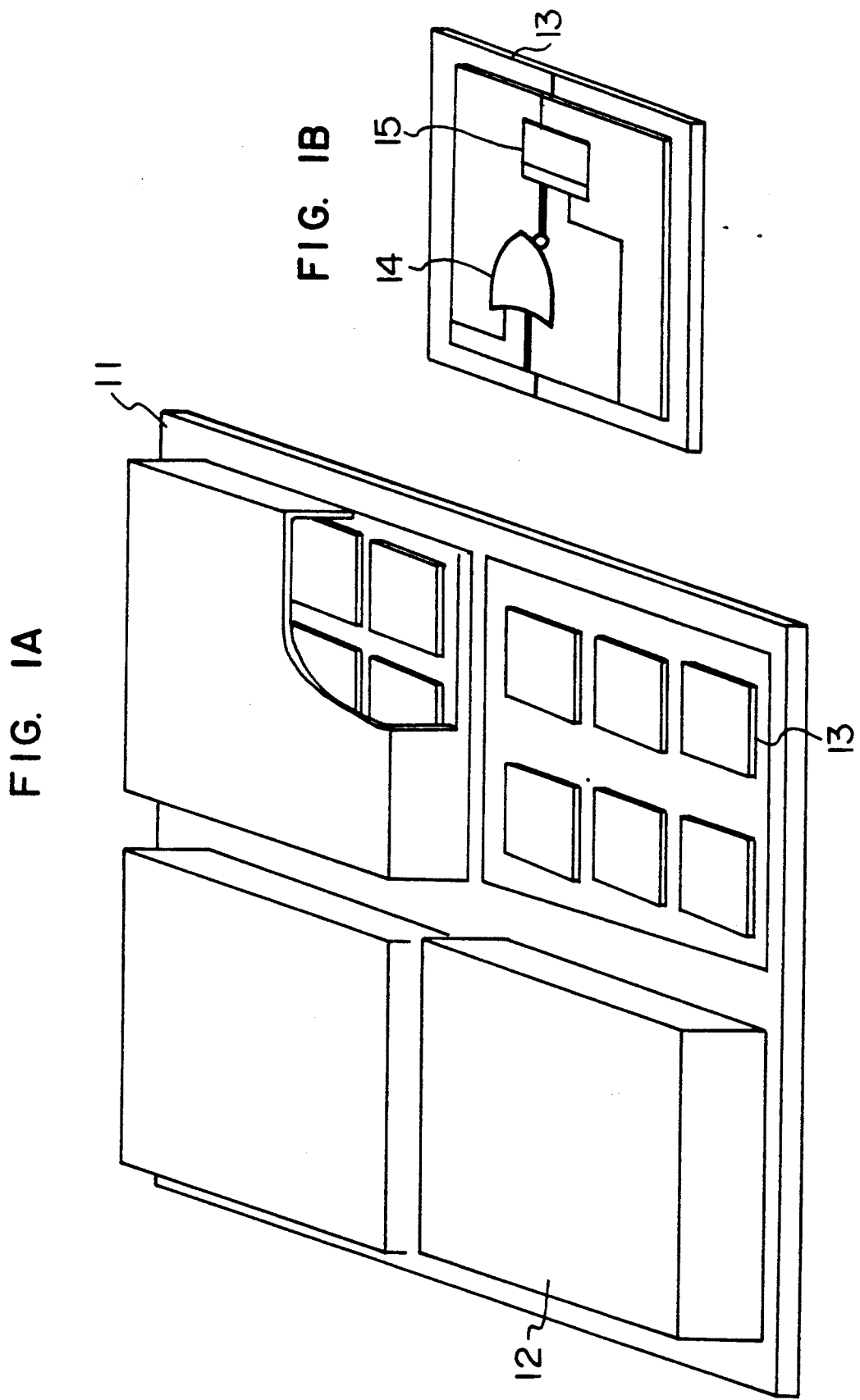
FIGS. 1A and 1B schematically illustrate a hardware system of a high speed logic operation apparatus such as a computer noting that FIG. 1B is a blown-up illustration of an LSI 13 from FIG. 1A.

FIGS. 1A and 1B (hereinafter referred to in common as FIG. 1) schematically illustrates a hardware system of a high speed logic operation apparatus, for example a computer. In FIG. 1, a CPU of the computer is partitioned into, for example, three hierarchies of a board 11, modules 12 and LSI's 13. The board 11 accommodates a plurality of modules 12 and each module 12 accommodates a plurality of LSI chips 13. Each LSI chip 13 includes gates, flip-flops and the like. The present invention relates to a method of assigning logic gates such as a multiplicity of gates 14, flip-flops 15 and the like constituting the computer to a plurality of logic elements such as, for example, a plurality of LSI chips, a plurality of modules and/or a plurality of boards.

Figure 2:
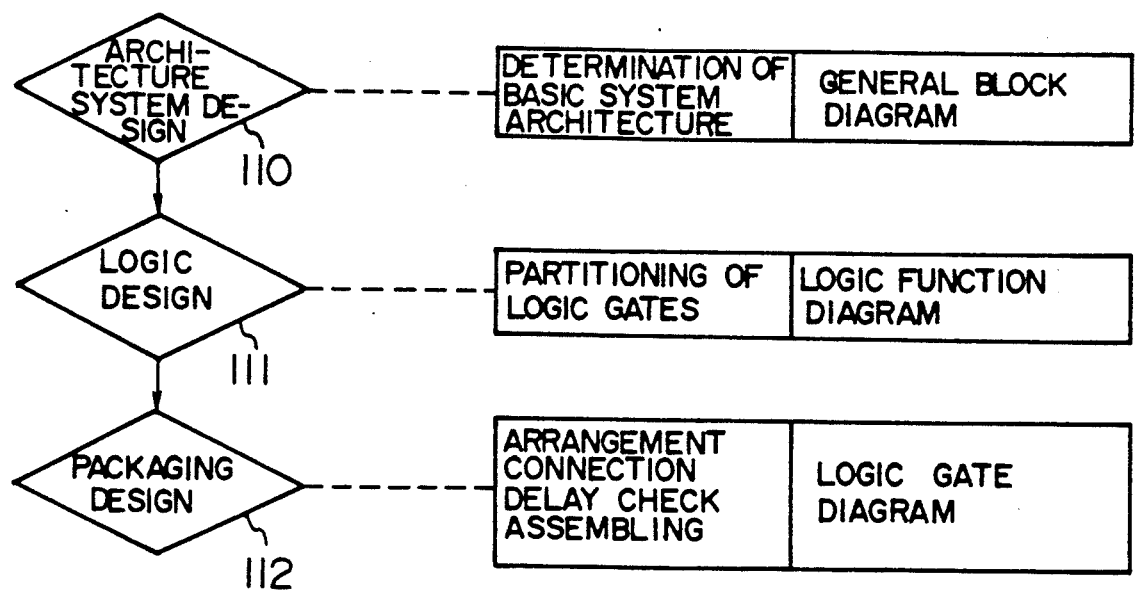
FIG. 2 is a schematic diagram showing a general design procedure of a computer.

FIG. 2 illustrates an outline of a procedure for a design of a computer. The computer is designed through steps of an architecture system design 110, a logic design 111 and a packaging design 112 for reduction to a product. In the system design 110, procedures of various processes in the computer are materialized and a general block diagram is prepared. In the logic design 111, logic operations and other processes in the computer are described by logical expressions on the basis of the general block diagram. Further, the logic operations and other processes in the computer are partitioned into logic operation functions for a plurality of chips on the basis of a cluster of logic operations to prepare a logic diagram at a function level. In the packaging design 112, the partitioned logic operation functions are assigned to a plurality of logic function elements, for example, a plurality of LSI chips, each of which can accommodate a plurality of logic gates, and arrangement and connection for each of the logic gates are made. The above design operation can provide the necessary data for manufacturing LSI chips and printed wiring boards actually. The data are used to perform manufacturing and assembling of components so that a computer is manufactured as a product. The present invention is useful for effecting automatic partitioning of logic gates in the logic design 111 and in such a manner that the design time for a computer or the like can be reduced greatly.

Figure 3:
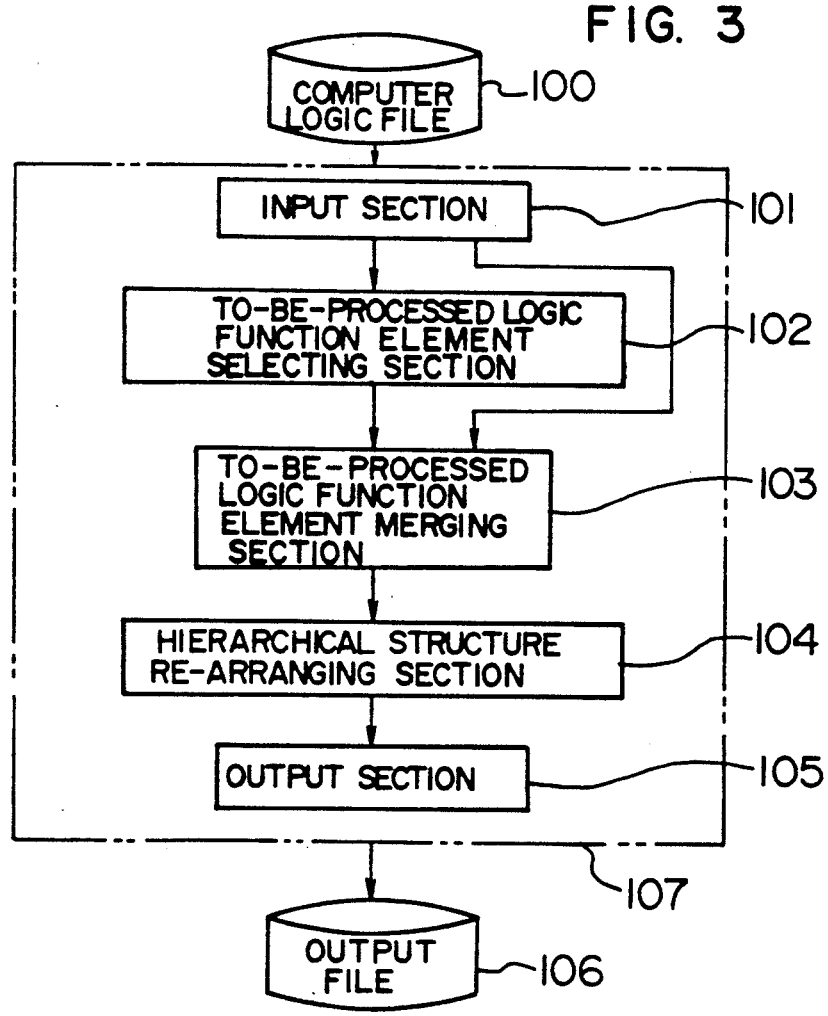
FIG. 3 is a block diagram of a logic gate assigning apparatus according to an embodiment of the present invention.

FIG. 3 is a block diagram of a logic gate assigning apparatus according to an embodiment of the present invention. The logic gate assigning apparatus 107 comprises an input section 101, a selecting section 102 for selecting to-be-processed logic function elements, a merging section 103 for merging the to-be-processed logic function elements, a rearranging section 104 for producing a new hierarchical structure, and an output section 105. The input section 101 reads out initial data concerning computer logic such as, for example, hierarchical description of logic operation and hardware specification from a computer logic file 100 stored in a memory medium such as a magnetic disk or an optical disk and supplies the data to the selecting section 102. The selecting section 102 utilizes a first hierarchical structure in terms of a cluster of logic functions and selects the to-be-processed logic function elements. The merging section 103 quantifies strengths of connection among the to-be-processed logic function elements and classifies the to-be-processed logic function elements on the basis of the quantified strengths. The hierarchical structure rearranging section 104 modifies the cluster of logic functions in the first hierarchical structure in accordance with the classified result and rearranges a hierarchical structure (i.e., produces a second hierarchical structure). The output section 105 receives data concerning the second hierarchical structure from the rearranging section 104 and stores the data into the output file 106 such as a magnetic disk.

A computer logic file 100 serving as input means will now be described with reference to FIGS. 4A, B and C (hereinafter referred to in common as FIG. 4), noting that FIGS. 4B and 4C are blown-up versions of portions of FIG. 4A. In FIG. 4, a CPU 16 includes a GU 161 (General Unit), an IU 162 (Instruction Unit) and an FU 163 (Floating Point Operation Unit). Further, the GU includes, for example, an adder 1611 and a register 1612. In this manner, information concerning logic functions formed into a cluster is stored in the computer logic file 100 in a hierarchical structure form. Accordingly, by adopting the structure in which logic configuration is described for each hierarchy in the above manner, general-purpose components used for various logic functions such as an adder may be described only once so that an amount of data file can be reduced.

Next, operation of the logic gate assigning apparatus 107 will be described, in which the hierarchical description in terms of a cluster of the logic functions is used, and the number of logic function elements to be processed is reduced to shorten the processing time by the hierarchical partition.

Figure 5:
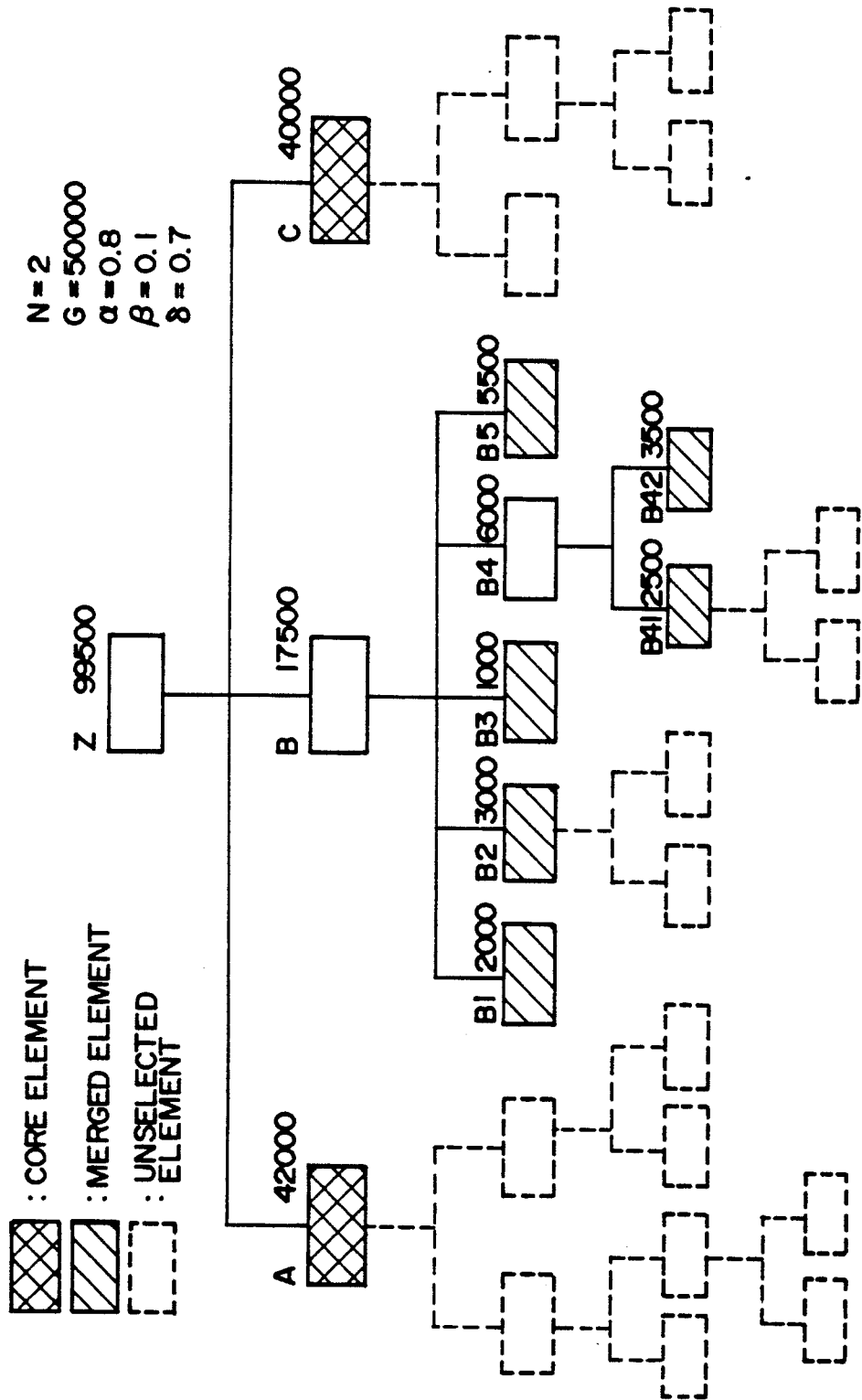
FIG. 5 shows an example of a hierarchical logic structure of a CPU of a computer and illustrates selection of a to-be-processed logic function element.

The hierarchically described computer logic to be inputted will now be described with reference to FIG. 5. The hierarchical structure is formed of a tree structure. Each of the boxes will be referred to as a logic function element (hereinafter merely referred to as an element). An element branched down from an element represents a next lower level element. When a computer logic (corresponding to, for example, the CPU 16 shown in FIG. 4) is composed of A, B and C, the tree structure of FIG. 5 can be represented such that next lower level elements (constituent elements) of a highest element Z are A, B and C (corresponding to, for example, the GU 161, the IU 162 and the FU 163 shown in FIG. 4). The number of logic gates (hereinafter merely referred to as gates) included in an element is shown at an upper right portion of each of the boxes so that the number of gates included in the highest level element Z is equal to a sum of the number of gates included in A, B and C and the number of gates included in B is equal to a sum of the number of gates included in B1, B2, B3, B4 and B5. Further, each element represented by one box has a cluster of closely tied logic functions, and, accordingly, the tree structure represents a hierarchical structure in terms of a cluster of logic functions. In FIG. 5, the number N of hardware components, that is, core elements for the partitioning, is 2.

The to-be-processed logic function element selecting section 102 will now be described. The selecting section 102 selects to-be-processed elements in accordance with certain criteria (for example, criteria to be described below) from the computer logic inputted from the input section 101 on the basis of the cluster of logic functions and processes the selected elements so that the partitioning process (assigning process of logic gates) is performed for the whole logic structure. A certain number of elements are assigned to a hardware component. An element including gates of which the number approximates a maximum allowable number G of logic gates which a hardware component can accommodate is determined as a core element and elements which include a small number of gates are merged with such core element. To this end, two kinds of to-be-processed logic function elements, i.e., representative elements each to be assigned to hardware components, that is, the core elements and elements to be merged therewith, are selected from a multiplicity of elements arranged in a hierarchical structure (first hierarchical structure). Namely, the following expressions are used as selection criteria. Assuming that g is the number of gates includes in an elements, $\alpha$ is a parameter for determining a core element, and $\beta$ is a parameter for determining an element to be merged, an element satisfying $$\alpha G \leq g \leq G \quad (1)$$

is selected as a core element, and an element satisfying $$g \leq \beta G \quad (2)$$

is selected as an element to be merged with a core element. In FIG. 5, =50,000, $\alpha=0.8$ and $\beta=0.1$.

Figure 6:
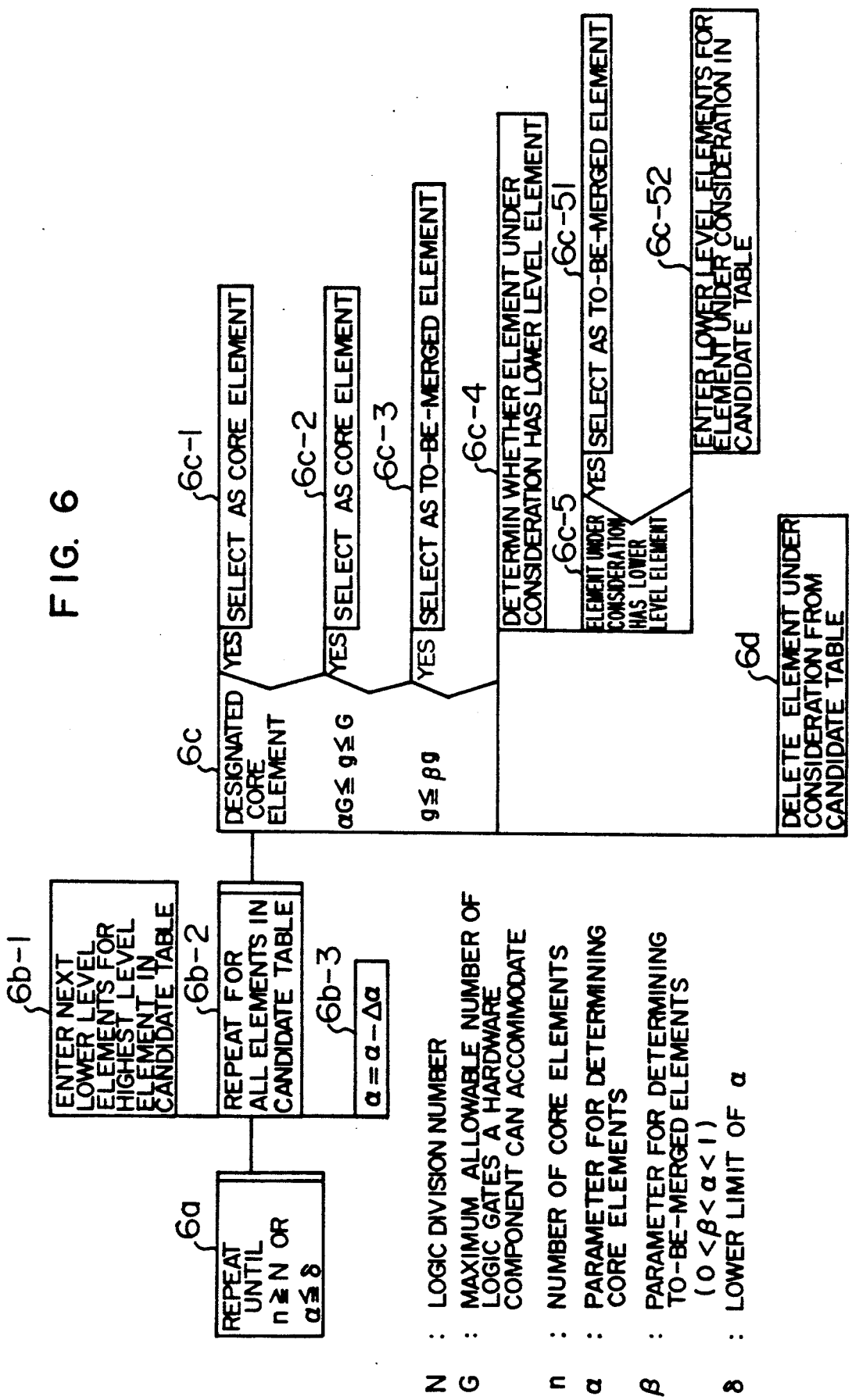
FIG. 6 shows a procedure for selection of to-be-processed elements in a logic partitioning method according to an embodiment of the present invention.

Further, an element which does not satisfy both of expressions (1) and (2) and has no next lower level element is defined as an element to be merged. A specific operation will be described by using a PAD diagram of FIG. 6. Steps 6b-1 to 6b-3 are repeated until the number n of core elements for partition becomes equal to or exceeds a logic division number N (that is, the number of hardware components) or until $\alpha$ is equal to or exceeds a lower limit $\delta$ of $\alpha$. A function that a core element for a hardware component which does not satisfy the equation (1) may be manually specified is added. A core element for partition is selected in steps 6c-1 and 6c-2, and an element to be merged is selected in steps 6c-3 and 6c-51. In the first hierarchical structure shown in FIG. 5, the next lower level elements A, B and C for the highest level element Z are entered in a candidate table (6b-1). The element A is selected as a core element for partition in accordance with expression (1) (6c-2). Since the element B does not satisfy both of expressions (1) and (2) and has next lower level elements (6c-4), the next lower level elements B1, B2, B3, B4 and B5 for the element B are entered in the candidate table (6c-52). The element C is selected as a core element for partition in accordance with expression (1). The same procedures are repeated so that the elements B1, B2 and B3 are selected as elements selected as an element to be merged by the steps 6c-51. Since the element B4 does not satisfy both of the expressions (1) and (2) and has next lower level elements, the next lower level elements B41 and B42 for the element B4 are entered in the candidate table. The elements B41 and B42 are selected as elements to be merged by the step 6c-3. Elements which have been selected as the to-be-processed elements or of which next lower level elements have been entered in the candidate table are deleted from the candidate table (step 6d). In this manner, elements to be processed are found out in accordance with a cluster of logic functions by the top-down system. It will be understood that since elements shown by broken line of FIG. 5 and positioned in the hierarchy lower than the elements to be partitioned are not selected as elements to be processed and are not directly partitioned, a processing amount can be reduced greatly.

The merging section 103 which effects classification for rearrangement of the selected to-be-processed elements will now be described. The classification is made in such a manner that a core element is first assigned to each of the hardware components, and an element having a strong logical connection to each of the core elements is then merged with the core element. The core elements grow to an element group with progression of the merging process. The degree of the cluster of logic gates is quantified as a connection factor, and classification for merging of the to-be-processed elements arranged in the first hierarchical structure shown in FIG. 5 is made using the connection factor as a guideline. The connection factor $R_{X,Y}$ between two elements EX and EY is defined, for example, as follows:

$$R_{X,Y} = \max\left[\frac{r_{X,Y}}{P_X}, \frac{r_{X,Y}}{Y_Y}\right]$$

where $r_{X,Y}$: number of connections between elements EX and EY, $R_X$: number of all connections of element EX, and $R_Y$: number of all connections of element EY.

Figure 7:
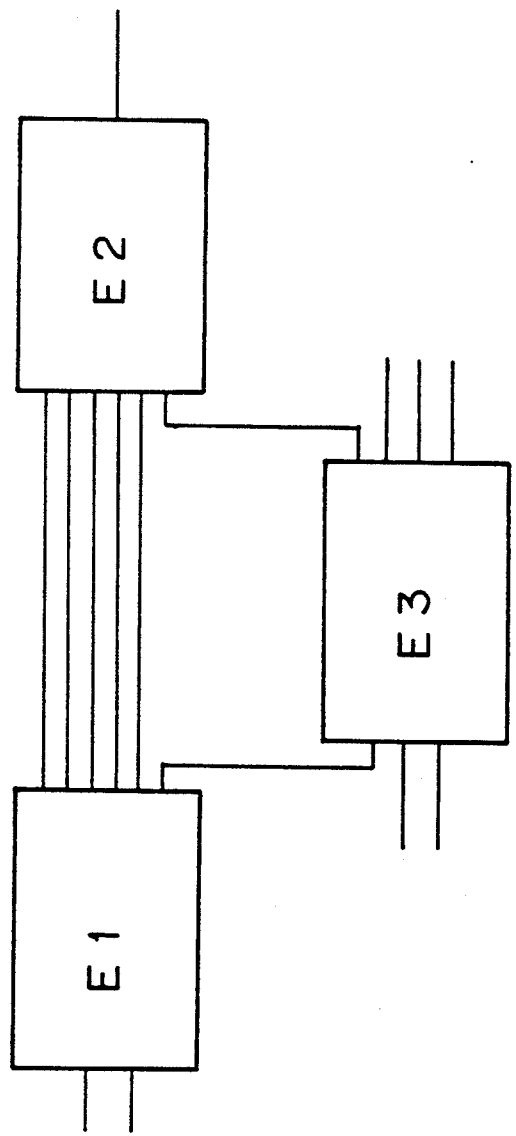
FIG. 7 illustrates strength of connection among logic function elements.

The connection factor represents strength of connection among elements such that when elements E1, E2 and E3 are connected to each other, for example, as shown in FIG. 7, the connection factor between the elements E1 and E2 are 5/7, the connection factor between the elements E1 and E3 is 1/7 and so on.

Figure 8A:
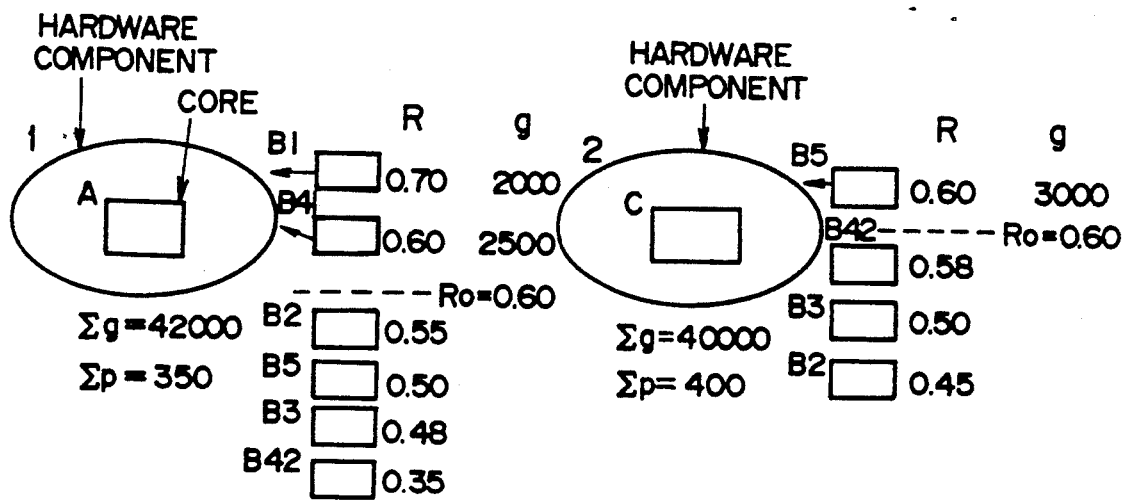
FIGS. 8A to 8C illustrate a manner in which the to-be-processed elements selected in an embodiment of the present invention are classified into two element groups on the basis of strengths of connection for rearrangement.
Figure 8B:
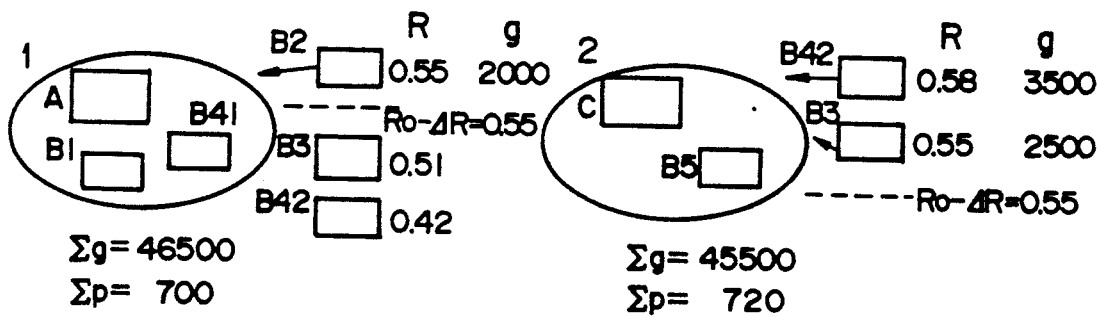
Figure 8C:
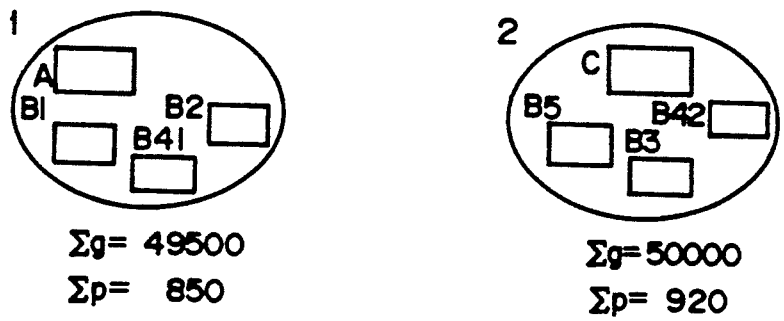

Merged elements of the to-be-processed elements arranged in the first hierarchical structure as shown in FIG. 5 will now be described with reference to FIGS. 8A to 8C. Connection factors between a core element A for partition and all elements to be merged are calculated (steps 9c-1 and 8d of FIG. 9). In this example, since an initial value $R_o = 0.60$ of the connection factor is used (step 9a-1 of FIG. 9), elements B1 and B41 having connection factors of 0.60 or more with respect to the core element A are merged. The merging is made such that not only criteria of the connection factor are satisfied, but also the total number $\Sigma g$ of gates and the total number $\Sigma p$ of pins of merged elements, for example, do not exceed the maximum allowable number G of gates that the hardware component can accommodate and the maximum allowable number P of pins that the hardware component can carry, respectively (step 9c-3 of FIG. 9). Then, connection factors between a core element C for partition and elements B2, B3, B5 and B42 which are not merged with the core element A are calculated (steps 9b-1, 9c-1 and 9d of FIG. 9), and the element B5 having a connection factor of 0.60 or more is merged with the core element C (FIG. 8A) (steps 9c-2 and 9c-3 of FIG. 9). The connection factor is decremented by $\Delta R$ (for example, 0.05) and the same operation as above is repeated to the remaining elements. Consequently, the to-be-processed elements pass through the state of FIG. 8B and are eventually classified into a group 1 consisting of elements A, B1, B2 and B41 and a group 2 consisting of C, B5, B3 and B42 as shown in FIG. 8C.

Figure 9:
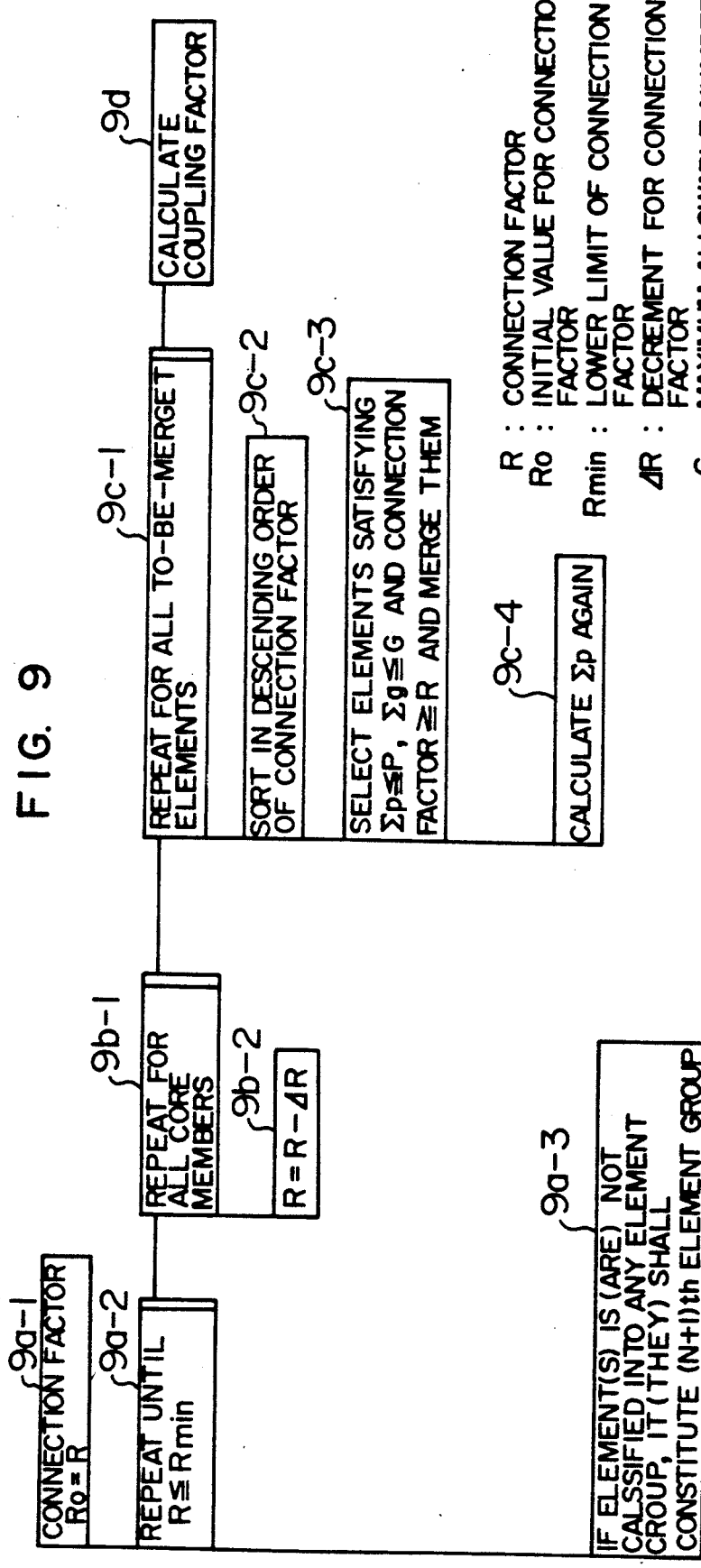
FIG. 9 illustrates a procedure for merging and classifying the to-be-processed elements in the logic partitioning method according to an embodiment of the present invention.

A procedure in which the partitioning is performed using a connection factor R as a guideline will b described with reference to FIG. 9. An initial value $R_o$ of the connection factor R is manually set (9a-1). Connection factors between one of the core elements and all of elements are calculated (9c-1 and 9d), and the connection factors are sorted in a descending order thereof (9c-2). Elements satisfying the restriction conditions that the total number ($\Sigma p$) of pins of elements to be merged is equal to or smaller than the maximum allowable number (P) of pins that the hardware component can carry and the total number ($\Sigma g$) of gates which the elements to be merged accommodate is equal to or smaller than the maximum allowable number (G) of gates which a hardware component can accommodate and having a connection factor which is equal to or larger than R are merged (9c-3). Connection factors between the remaining core elements and elements which have not been merged yet are calculated, and elements satisfying the same restriction equal to or larger than R are merged (9c-3). Then, the connection factor is decremented by $\Delta R$, and the same processes are repeated for the core element and elements which are not merged with any core elements (9a-2). Calculation of the connection factor is stopped until the connection factor becomes $R_{min}$. In the first merging stage shown in FIG. 8A, for example, an element A constitutes a core, and the core grows to an element group having A, B1 and B41 in the second merging stage shown in FIG. 8B. In this manner, the cores grow. The number ($\Sigma p$) of pins of the core is updated each time the merging is effected. If there are elements to be merged which do not belong to an core, all of the elements constitute an (N+1)th hardware component (9a-3). Consequently, the selected to-be-processed elements shown in the first hierarchical structure in FIG. 5 are generally merged and classified into a plurality of element groups.

The hierarchical structure rearranging section 104 will now be described. The rearrangement for a new hierarchical structure is a procedure of rearranging a hierarchical structure in which a relation between a parent-children (relation of inclusion) has been impaired by the classification into a second (new) hierarchical structure on the basis of the classification result.

Figure 10A:
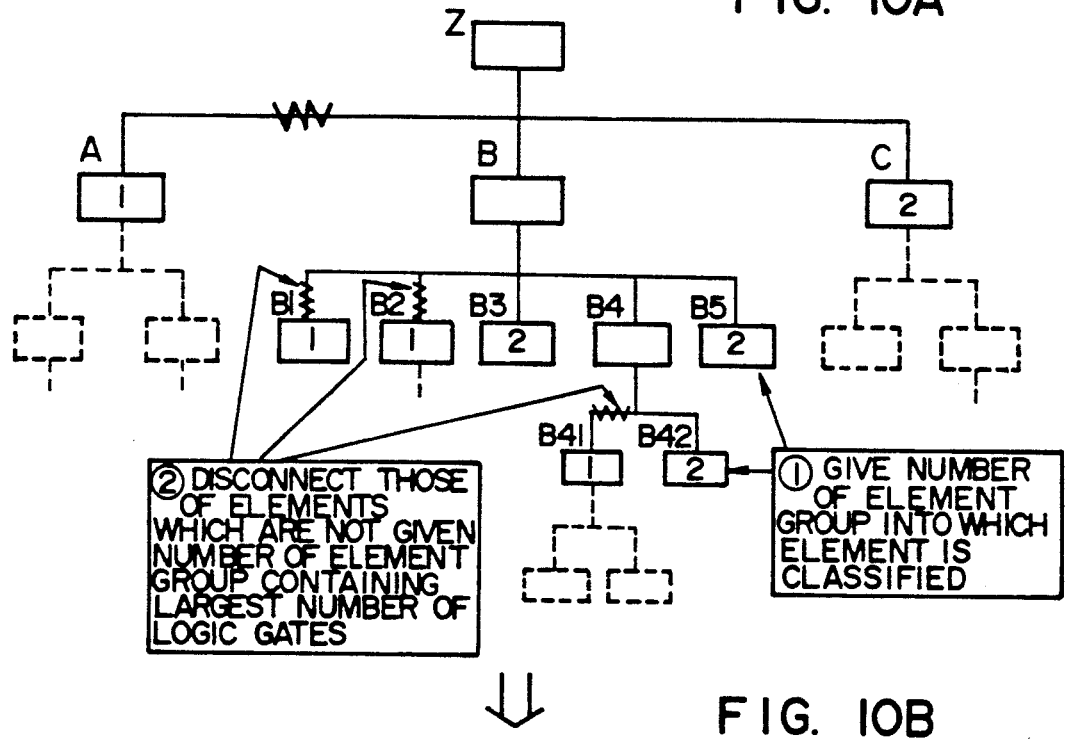
FIGS. 10A and 10B illustrate a manner of producing a hierarchical structure in which the to-be-processed elements are rearranged in accordance with the merged and classified results shown in FIGS. 8A to 8C and FIG. 9 according to an embodiment of the present invention.
Figure 10B:
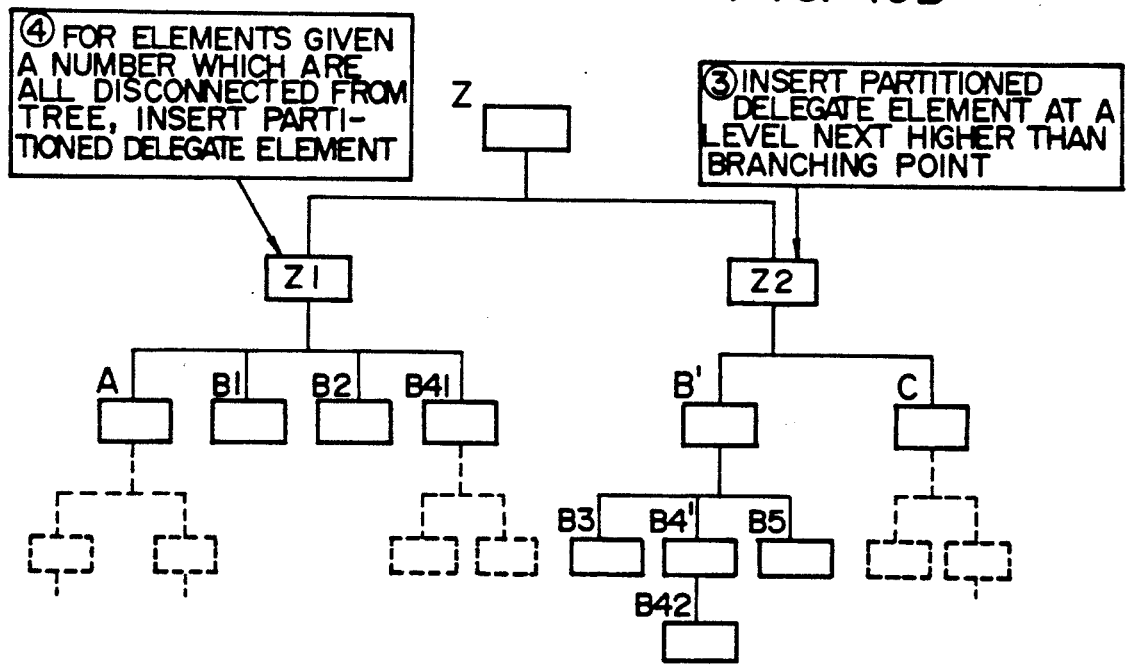

The rearranging procedure of the new hierarchical structure will now be described with reference to FIGS. 10A and 10B. The hierarchical structure shown in FIG. 10A is the same as the hierarchical structure in which the partitioning procedure has been described in the example of FIGS. 5 and 8A to 8C. In the tree structure (hierarchical structure) of FIG. 10A, the classification numbers of the element groups shown in FIG. 8C are assigned to elements to be processed. As shown in FIG. 8C, "1" is given to the elements A, B1, B2 and B41 included in the element group 1 and "2", is given to the elements C, B5, B3 and B42 included in the element group 2. A number is then given to a parent element (for example, element B4) including one or more elements to be processed. The same number as that of the next lower level element is given to the parent elements in principle. When an element has two or more next lower level elements and the numbers thereof are different, the total number of gates included in the numbered element is calculated for each number, and the next lower level elements, except those having a number for which the total number of gates is the largest, are disconnected so that the same number as that of the element having the largest total number of gates is given to the parent element. In the tree structure of FIG. 10A, since B41 has 2500 gates and B42 has 3500 gates, B41 is disconnected and B4 is given a number 2. A cluster of logic functions can be preserved with regard to the lower hierarchies of elements A and C. In this manner, numbers are given to higher level elements in the tree structure. In the next lower level to the highest level element Z, a partitioned delegate element Z2 is inserted at a level next higher than a branching point of the identical number. When all of the elements having a certain number are disconnected, a partitioned delegate element Z1 is inserted as a next lower level element to the higher element Z. This example is shown by the to-be-processed element having number 1. The tree structure shown in FIG. 8B is a second, rearranged hierarchical structure. The logic gate assigning apparatus 107 produces the hierarchical structure rearranged as above through the output section 105.

Effects of reduction of the number of to-be-processed elements and reduction of the time for logic gate assignment in the abovementioned logic gate assignment apparatus will now be described. In a computer logic having 5596 gates, if partitioning conditions exist that logic division is made by two, the maximum allowable number G of gates the hardware component can accommodate is 2800, the maximum allowable number of pins the hardware component can carry is 500, $\alpha = 0.2$ and $\beta = 0.1$, the number of to-be-processed elements was 5596 in the conventional method in which lowest level gates must be directly processed in the hierarchical structure. On the other hand, under these same conditions number of to-be-processed elements was 72 in the present embodiment. A reduction ratio is 1/78. The time for logic gate assignment is 1/6000.

In the case where the inside of the computer shown in FIG. 1 is constituted by three hierarchies of boards, modules and LSI's, the computer can be divided into three hierarchies when the sections 101 to 105 of the apparatus 107 of FIG. 3 are operated three times. After the automatic logic partitioning has been made by the logic gate assigning apparatus 107, arrangement, connection and delay check are performed as shown in FIG. 2 for designing the computer.

We claim:

1. A method of assigning a plurality of logic function elements arranged in a hierarchical structure representative of connection relations among a plurality of logic gates to a plurality of hardware components, to be used for forming a high speed logic apparatus, each of which apparatus components can accommodate a predetermined maximum allowable number of logic gates and each of which can carry a predetermined maximum allowable number of input and output pins, each of said logic functions elements including at least one logic gate, the method comprising the steps of:

assigning to one of said hardware components(1) those logic function elements which include logic gates the number of which is larger than a first condition value and is smaller than a maximum allowable number of logic gates which one of said hardware components can accommodate and (2) those logic function elements which include logic gates the number of which is smaller than a second condition value;

assigning to one of said hardware components those of next lower level logic function elements to the remaining logic function elements which include logic gates the number of which is smaller than said second condition value; and repeating the first-mentioned step for those of next lower level logic function elements to said remaining logic function elements which include logic gates the number of which is not smaller than said second condition value to thereby assign logic function elements to the hardware components to be used for forming a high speed logic apparatus.

2. A method according to claim 1, wherein values representative of strength of connection of said logic function elements with regard to each of the logic function elements already assigned to hardware components are determined, and wherein said logic function elements are assigned to hardware components which logic function elements have already been assigned with respect to which said logic function elements have maximum values representative of strengths of connection, thereby assigning logic function elements to any of the plurality of hardware components, where a ratio of the number of connections between any one of said logic function elements and said logic function elements which have been already assigned to one of said hardware components to a total number of connections f said any one of logic function elements is defined as a first value, and a ratio of the number of connections between said any one of logic function elements and said logic function elements which have been already assigned to said one of hardware components to a total number of connections of one of said logic function elements which have been already assigned to said one of hardware components is defined as a second value, wherein a larger one of said first and second values is defined as said value representative of strength of connection of said logic function elements.

3. A logic gate assigning apparatus which is supplied as input data with a plurality of logic function elements arranged in a hierarchical structure representative of connection relations among a plurality of logic gates and maximum allowable numbers of logic gates which a plurality of hardware components can accommodate and maximum allowable number of input and output pins which the plurality of hardware components can carry, and which produces as an output data a result of assigning the logic function elements to the plurality of hardware components to be used for forming a high speed logic apparatus, each of said logic function elements including at least one logic gate, the apparatus comprising means for assigning (1) those of logic function elements which include logic gates the number of which is larger than a first condition value and is smaller than a maximum allowable number of logic gates which one of said hardware components can accommodate and (2) those of logic function elements which include logic gates the number of which is smaller than a second condition value to said one of said hardware components, and means for selecting, from the other logic function element, logic function elements at next lower level having a cluster of logic functions, and assigning the next lower level logic function elements to a different one of the plurality of hardware components when the number of gates included in the selected logic function elements is smaller than said second condition value and for repeating the above process for said logic function elements at the next lower level when the number of gates included in the selected logic function elements is not smaller than said second condition value to thereby assign logic function elements to the hardware components to be used for forming a high speed logic apparatus.

4. A method of physically assigning a plurality of logic gates to a plurality of hardware components to be used for forming a high speed logic apparatus, said logic gates being logically arranged in a first hierarchical structure in terms of a cluster of logical functions in which at least one of a plurality of logic function elements at on level accommodates at least one logic function element at a lower level, and in which each of said logic gates is included in one of said logic function elements, the method comprising the steps of:

selecting a number of logic function elements as to-be-processed function elements among said logic function elements in said first hierarchical structure on the basis of the number of said plurality of hardware components and a maximum allowable number of gates each of said hardware components can accommodate;

classifying said selected to-be-processed function elements in said first hierarchical structure into at least two elements groups on the basis of strengths of connection among said to-be-processed function elements, a maximum allowable number of pins each of said hardware components can carry, and said maximum allowable number of gates each of said hardware components can accommodate; and rearranging said selected to-be-processed function elements in said first hierarchical structure into a second hierarchical structure in terms of a cluster of logical functions in which all of said to-be-processed function elements are partitioned into said plurality of element groups so that each of said element groups corresponds of those of said logic function elements which are physically assignable to a different one of said hardware components to thereby assign logic function elements to the hardware components to be used for forming a high speed logic apparatus.

5. A method according to claim 4, in which:

in said selecting step, N logic function elements among said selected logic function elements (N being equal to the number of said hardware components) are defined as core elements in which numbers of logic gates for said N logic function elements are closer to said components can accommodate than the other selected logic function elements, while the other selected logic function elements are defined as merged elements to be merged with said core elements; and in said classifying step, said at least two element groups are N groups each including a different one of said core elements and a plural number of said merged elements merged with the core element on the basis of strengths of connection among said to-be-processed function elements, said maximum allowable number of pins each of said hardware components can carry, and said maximum allowable number of gates each of said hardware components can accommodate.

6. An apparatus for physically assigning a plurality of logic gates to a plurality of hardware components to be used for forming a high speed logic apparatus, said logic gates being logically arranged in a first hierarchical structure in terms of a cluster of logical functions to constitute a high speed logic operation apparatus in which at least one of a plurality of logic function elements at one level accommodates at least one logic function element at a lower level, and in which each of said logic gates is includes in one of said logic function elements, the apparatus comprising:

a first memory for storing therein at least initial data with respect to hierarchical descriptions of logic operation of and hardware specification of said high speed logic operation apparatus, the data on said hardware specification including data with respect to a number of said plurality of hardware components, a maximum allowable number of gates each of said hardware component can accommodate, strengths of connection among said function elements, and a maximum allowable number of pins each of said hardware components can carry;

an input section for receiving said initial data from said first memory and for buffering the initial data;

means coupled to said input section for selecting a number of logic function elements as to-be-processed function elements among said logic function elements in said first hierarchical structure on the basis of the number of said plurality of hardware components and the maximum allowable number of gates each of said hardware components can accommodate;

means coupled to said input section and said selecting means for classifying said selected to-be-processed function elements in said first hierarchical structure into at least two element groups on the basis of strengths of connection among said to-be-processed function elements, a maximum allowable number of pins each of said hardware. components can carry, and said maximum allowable number of gates each of said hardware components can accommodate;

means coupled to said classifying means for rearranging said selected to-be-processed function elements in said first hierarchical structure into a second hierarchical structure in terms of a cluster of logical functions in which all of said to-be-processed function elements are partitioned into said plurality of element groups so that each of said element groups corresponds to those of said logic function elements which are physically assignable to a different one of said hardware components;

an output section for receiving data from said rearranging means with respect to said second hierarchical structure and for buffering the received data; and a second memory for storing therein said received data with respect to said second hierarchical structure to thereby assign logic function elements to the hardware components to be used for forming a high speed logic apparatus.

7. An apparatus according to claim 6, in which:

said selecting means has a structure for selecting N logic function elements among said selected logic function elements (N being equal to the number of said hardware components) as core elements in which number of logic gates for said N logic function elements are closer to said maximum allowable numbers of gates said hardware components can accommodate than the other selected logic function elements, and a structure for selecting the other selected logic function elements as merged elements to be merged with said core elements; and said classifying means has a structure for classifying said selected to-be-processed function elements in said first hierarchical structure into N element groups, each including a different one of said core elements, and a plural number of said merged elements merged with the core element on the basis of strengths of connection among said to-be-processed function elements, said maximum allowable number of pins each of said hardware components can carry, and said maximum allowable number of gates each of said hardware components can accommodate.

* * * * *